(12) United States Patent
Ushinsky

(10) Patent No.: US 9,478,936 B2
(45) Date of Patent: Oct. 25, 2016

(54) LASER CRYSTAL COMPONENTS JOINED WITH THERMAL MANAGEMENT DEVICES

(71) Applicant: Raytheon Company, Waltham, MA (US)

(72) Inventor: Michael Ushinsky, Irvine, CA (US)

(73) Assignee: Raytheon Company, Waltham, MA (US)

( * ) Notice: Subject to any disclaimer, the term of this patent is extended or adjusted under 35 U.S.C. 154(b) by 162 days.

(21) Appl. No.: 13/890,970

(22) Filed: May 9, 2013

(65) Prior Publication Data
US 2013/0243017 A1    Sep. 19, 2013

Related U.S. Application Data

(62) Division of application No. 12/881,952, filed on Sep. 14, 2010, now Pat. No. 8,483,248.

(51) Int. Cl.
| | |
|---|---|
| *B05C 13/02* | (2006.01) |
| *C23C 14/04* | (2006.01) |
| *C23C 16/04* | (2006.01) |
| *H01S 5/024* | (2006.01) |

(Continued)

(52) U.S. Cl.
CPC ............... *H01S 5/024* (2013.01); *B05C 13/02* (2013.01); *C23C 14/04* (2013.01); *C23C 16/04* (2013.01); *C30B 29/28* (2013.01); *C30B 31/22* (2013.01); *H01S 3/042* (2013.01); *H01S 3/0621* (2013.01); *H01S 3/0627* (2013.01); *H01S 3/1643* (2013.01); *H01S 3/1666* (2013.01); *Y10T 156/10* (2015.01)

(58) Field of Classification Search
CPC ....... H01S 3/0621; C23C 8/04; C23C 14/04; C23C 14/042; C23C 16/04; C23C 16/042; B05C 13/00; B05C 13/02; Y10T 29/49998

USPC .......................... 118/500, 503, 721, 504, 505
See application file for complete search history.

(56) References Cited

U.S. PATENT DOCUMENTS 4,847,119 A * 7/1989 Chin et al. .................... 427/282
5,561,684 A    10/1996 Martin (Continued)

FOREIGN PATENT DOCUMENTS

| WO | WO 00/77893 A2 | 12/2000 |
|---|---|---|
| WO | WO 2007/125347 A2 | 11/2007 |

OTHER PUBLICATIONS

Vazquez, G. V., et al., "Improved surface quality of Nd:YAG monitored by second harmonic generation", Optics Communications, vol. 167, No. 1-6 pp. 171-176 (Aug. 1999).

(Continued)

Primary Examiner — Dah-Wei D Yuan
Assistant Examiner — Stephen Kitt

(57) ABSTRACT

A method for preparing a surface of a YAG crystal for thermal bonding includes performing an ion implantation process to introduce nitrogen into a surface layer of the YAG crystal to replace depleted oxygen therein, to change surface energy of the surface layer of the YAG crystal and to provide desired bonding characteristics for the surface layer; and joining the ion implanted surface layer with a thermal management device configured to dissipate heat from the YAG crystal. Also, a micro-chip device having a YAG crystal whose surface is prepared with the above disclosed method is provided and a device for forming a metallization pattern on a surface of the YAG crystal is provided.

21 Claims, 7 Drawing Sheets

(51) Int. Cl.
  C30B 29/28   (2006.01)
  C30B 31/22   (2006.01)
  H01S 3/042   (2006.01)
  H01S 3/06    (2006.01)
  H01S 3/16    (2006.01)

(56) References Cited

U.S. PATENT DOCUMENTS

| | | | |
|---|---|---|---|
| 5,563,899 | A | 10/1996 | Meissner et al. |
| 5,706,302 | A | 1/1998 | Shimizu |
| 5,846,638 | A | 12/1998 | Meissner |
| 6,045,671 | A * | 4/2000 | Wu et al. .................. 506/40 |
| 6,222,870 | B1 | 4/2001 | Sousa et al. |
| 7,027,477 | B2 | 4/2006 | Sutter et al. |
| 2001/0022216 | A1 * | 9/2001 | Ye .................. H01J 37/321 156/345.1 |
| 2002/0102754 | A1 * | 8/2002 | Fujimori et al. ............. 438/22 |

OTHER PUBLICATIONS

Partial European Search Report dated Dec. 6, 2011 of EP 11173936.3 filed Jul. 14, 2011 (7 pages).
Balandin, Alexander & Wang, Kang L., "Significant Decrease of the Lattice Thermal Conductivity Due to Phonon Confinement in a Free-Standing Semiconductor Quantum Well," Physical Review B, vol. 58, No. 3, The american Pysical Society, pp. 1544-1549 (1998).
Balandin, Alexander, "Nanoscale Termal Management," IEEE Potentials, pp. 11-15 (2002).
Buzzard, Garry Developments in Laser target Detection Device Tech.; Thales Missile Elecs. Ltd.; Special Technical Presentation (2004).
Feldman, R. et al., "Dynamics of Chromium Ion Valence Transformations in Cr, Ca: YAG Crystals Used as Laser Gain and Passive Q-Switching Media," Optical Materials 24, pp. 333-344 (2003).
Mills, Anthony F., "Basic Heat and Mass Transfer," Irwin, (1995).
Myatt, Chris et al., "Optical Contacting: Changing the Interface of Optics," Document 20060101, Precision Photonics Corp.(2006).
Naidich, Y. V. et al., "Liquid Metal Wettability and Advanced Ceramic Brazing," Journal of European Ceramic Society, vol. 28, pp. 717-728 (2008).
Naidich, Y.V. et.al., "Progress in Ceramics/Metal Joining," Brazing and Soldering; Proceedings of the 3rd Int'l Brazing and Soldering Conf., ASM Int'l, pp. 44-53 (2006).
Ripin, Daniel J. et al., "165-W Cryogenically Cooled Yb:YAG Laser," Optics Letters, vol. 29, No. 18, pp. 2154-2156 (2004).
Suhir, E., "Analytical Thermal Stress Modeling in Physical Design for Reliability of Micro- and Opto-Electronic Systems: Role, Attributes, Challenges, Results," TIMA Editions/Therminic, pp. 84-97 (2005).
Suhir, E. et al., "Micro- and Opto-Electronic Materials and Structures: Physics, Mechanics, Design, Reliability, Packaging," Springer (2007).
Uschitsky, M. & Suhir, E., "Moisture Diffusion in Epoxy Molding Compounds Filled with Particles," ASME, Journal of Electronic Packaging, vol. 123, pp. 47-51 (2001).

* cited by examiner

LASER CRYSTAL COMPONENTS JOINED WITH THERMAL MANAGEMENT DEVICES

CROSS-REFERENCE TO RELATED APPLICATIONS

This application is a divisional of U.S. patent application Ser. No. 12/881,952, filed Sep. 14, 2010, entitled "LASER CRYSTAL COMPONENTS JOINED WITH THERMAL MANAGEMENT DEVICES." This application hereby claims the benefit and/or priority to U.S. patent application Ser. No. 12/881,952 and hereby incorporates it by reference as if fully set forth herein.

GOVERNMENT RIGHTS

This invention was made with Government support under contract number N00019-04-C-0003 awarded by DEPARTMENT OF THE NAVY (Naval Air Systems Command (PMA-259), Patuxent River, Md. 20670). The U.S. Government may have certain rights in this invention.

BACKGROUND

The present disclosure relates to a method for preparing a surface of a YAG crystal for thermal bonding; a micro-chip device having a YAG crystal whose surface is prepared from the disclosed method; and a device for forming a metallization pattern on the surface of the YAG crystal.

Yttrium Aluminium Garnet (YAG) is represented by $Y_3Al_5O_{12}$. YAG is a single crystal or crystalline ceramic material of the garnet group. YAG is generally used as a host material in various solid-state lasers. Some rare earth elements such as neodymium may be doped into YAG as active laser ions, yielding Nd:YAG lasers.

The recent advances in diode-pumped solid state lasers have facilitated extensive developments in the architecture of thermally manageable laser assemblies, including the micro-chip lasers. The micro-chip lasers are used as the major component in various laser proximity sensors and fuses. The laser components generally use Yb: YAG and Nd: YAG single crystals, as well as doped and undoped $Y_3Al_5O_{12}$ polycrystalline ceramics or similar lasing glasses. These materials are effective in both industrial and defense applications.

A proximity fuse generally includes a micro-chip laser cavity, a laser diode source, and a heat sink. The micro-chip includes a Nd3+:YAG gain media layer (plate) and a Cr4+ YAG passive Q-switch media layer (plate). Both these layers (i.e., the Nd3+: YAG gain media layer and the Cr4+ YAG passive Q-switch media layer) are precisely polished to obtain the high targeting planarity and minimum surface roughness and are then bonded.

U.S. Pat. No. 5,563,899, which is hereby incorporated by reference in its entirety, discloses a diffusion bonding technique for YAG. The diffusion bonding technique for YAG and/or chemically-assisted optical contacting processes (for example, disclosed in "Optical Contacting: Changing the Interface of Optics" by Ch. Myatt et al.; Document #20060101; Precision Photonics Corporation; 2006, which is hereby incorporated by reference its entirety) are often used for assembling the identical, similar and dissimilar crystal, ceramic, and glass lasing materials. The diffusion bonding technique for YAG and the chemically-assisted optical contacting processes are physically ("hydrolyzes of oxides") similar to each other. The diffusion bonding technique for YAG and the chemically-assisted optical contacting processes are different from each other in integration techniques and temperature-assisted processing. Also, both the diffusion bonding technique for YAG and the chemically-assisted optical contacting processes are equally applicable to integration of YAG and glass plates.

The micro-chip laser cavity is further formed by two dielectric coatings that are deposited on outer surfaces of Nd3+: YAG and Cr4+ YAG bonded plates. In general, the pump laser diode source generates 808 nanometer (nm) light beam. The light is then collimated in a collimated fiber output (or GRIN, or molded lens collimator) and delivered to the micro-chip laser cavity. The collimated light fiber output (before being delivered to micro-chip laser cavity 204) is illustrated in FIG. 2 by an arrow C. The light output from micro-chip laser cavity 204 is illustrated in FIG. 2 by an arrow D. The Q-switched (e.g., nanosecond pulse width or similar) pulsed light output at 1.06 μm wavelength is used in the sensor to define the distance to a moving target, which passes through a given space quadrant or sphere with the origin located in the center of the above micro-chip laser. This system, including the pumping light laser diode and the micro-chip laser, generates heat fluxes in laser diode and in microchip cavity. These heat fluxes have to be properly transferred, redistributed, and dissipated by means of an effective heat management device. The micro-chip laser assembly and laser diode are equipped with, for example, a Peltier cooler. This cooler and the attached heat spreader plate provide cross-plane mode heat sinking in the laser diode subassembly. The side surface of the cooler is also attached to the micro-chip laser and is configured to provide heat sinking of thermal flux that is generated in the laser micro-chip. With this arrangement, the second mode of heat transfer is primarily longitudinal.

In spite of simplicity of the above described design, the thermally-independent and precise sensing capability of the proximity fuse depends substantially on the ability of the thermal network to manage heat transfer in the laser diode and micro-chip cavity. This ability depends primarily on interfacial thermal resistance associated with the metal-oxide interfaces between YAG crystals or YAG ceramic components and metal heat spreaders. Also, the conventional interfacial conductance of dry and tight metal-oxide (ceramic) interfaces varies from 1,500 to 8,500. $W/m^2K$. In the case of single crystal YAG interfacing a metal thermal spreader, the interfacial conductance of dry and tight metal-YAG interface can exceed 10,000 $W/m^2K$. The diffusion bonding or optical contacting of YAG layers further induces interfacial thermal resistance at the interface of the essentially insulating Nd3+: YAG and Cr4+ YAG plates. The interfacial thermal resistance in the lattice disordered interface of Nd3+: YAG and Cr4+ YAG is also approaching 5,000-10,000 $W/m^2$ K.

The diffusion bonding process of single crystal Nd3+: YAG and Cr4+ YAG plates is schematically illustrated in FIGS. 3A-E which show a four-step thermo-mechanically assisted interaction between the crystals due to their diffusion bonding. FIG. 3A shows the two crystals before optical contacting each other, and FIG. 3B shows the two mating units (crystals) optically contacting each other. The hydrolyses of mating oxide surfaces generally governs optical contacting. The intermolecular interaction is controlled by Van der Waals attractive forces and is characterized by weak interfacial strength. FIG. 3C shows formation of an actual contact between the mating units (crystals) at high temperature, T applied after the above optical contacting. FIG. 3D shows further activation of the mating surfaces of the two mating units (crystals or ceramic plates). As shown in FIG.

3D, the formed active centers typically cover 0.1% of total-interface area, therefore limiting mass transfer processes through the interface. This in turn limits the lattice integrity of the bonded single crystal plates. In the case of identical or similar crystal materials, the major mass transfer mechanism is associated with the re-crystallization and co-sintering processes of the polished and nearly amorphous surface formations developed on the limited area active centers. These interactions are also weak, therefore causing imperfect interfaces reducing interfacial thermal conductance. In the case of ceramic materials, the major mass transfer mechanism is associated with the much more active grain boundary type re-crystallization and co-sintering involving not only the nearly amorphous surface formations but also the subsurface formations. The interfacial thermal conductance remains still limited. FIG. 3E shows the diffusion of dislocations and vacancies with insignificant grain boundary contribution on active centers. These lattice defects also contribute to the reduction of interfacial thermal conductance and strength. In all the diffusion bonding processes for single crystal and ceramic YAG, the mass transfer is limited by co-sintering of mating grains. Thus, the diffusion bonding of crystal and ceramic YAG plates further aggravates the heat transfer and thermal management in composite laser media.

In the case shown in FIGS. 3A-E, the mass transfer of YAG atoms is nearly impossible, while the dislocations and vacancies originated by the abusive grinding and polishing are easily accumulated at the plate interface. The process shown in FIGS. 3A-E assumes three major versions of optical contacting (wet, dry, and chemically assisted). In the case of optical contacting, the integration of plates leads to localized hydroxyl and van der Waals force bonds and are stimulated by active pressurization and heating. The bonds formed are characterized by limited strength and fracture toughness of interfacial and stress concentration, by moderate-to-high interfacial thermal resistance, and by the localization of the electromagnetic field on the imperfect interfaces. The diffusion bonding of lattice incoherent units leads to further weakened interfacial formations. Thus, the plate-bonded micro-chip lasers are further characterized not only by interfacial imperfections of macro-type but also by lattice compromised interface (micro-type). The compromised lattice interface is conventionally characterized by significantly decreased thermal conductivity due to dominating phonon confinement and scattering mechanisms. The micro-air pockets, the compromised planarity of mating interfaces, and several other factors further decrease the interfacial conductance. This aggravates thermal management and therefore prevents thermally-independent and precise sensing.

Currently available joining and packaging techniques for oxides and metals are often associated with the adhesive bonding, soldering and brazing processes. When these processes are conventionally applied to dissimilar material assemblies, the global and local mismatch thermal stresses are induced in the adherent laser crystals, ceramics, glasses, and alloys used in passive thermal spreaders and active coolers. The thermal processing that is associated with adhesive curing or soldering and brazing induces substantial thermal excursions and residual thermal stresses, as well as excessive and temperature-dependent displacements of adherent components. These factors lead to the temperature-dependent operations, further reducing the accuracy of sensing and fusing. Thus, there is a need for the precise, thermally manageable structural integration of crystal (or ceramic, or glass) laser components with various thermally conductive metals. This structurally strong joint should be formed from thermally compatible materials, and also be able to transfer and spread the heat fluxes.

One conventional system details the integration of active and complex Peltier-type cooler having a plurality of Peltier metal units with the ceramic substrates that are disposed to hold the Peltier elements. In this system, the integration of metal (Peltier units) with ceramic is achieved by the coating deposition of ceramic layers. The brazing is also proposed for further integration of the package. This process deals with the deposited dielectric ceramic layer that cannot be used as the lasing media in the application requiring high purity bulk crystal or ceramic YAG to transmit and amplify operational signal. Another conventional system details an optical system that includes a diode pump source and a thin disk gain media. An optical coupler is positioned between the diode pump source and the thin disk gain media to direct an output from the diode pump source to the thin disk gain media. This disk gain media is characterized by an anisotropic thermal expansion. The thermal mismatch with the first and second surfaces is therefore directional. The thermal compensation is provided by a special and approximate directional dicing (or cut) of the thin disk gain media, so that the thermal expansion mismatch is partially compensated by proper directional cut and by closely matched orientation of cooling surface. Both these conventional technical solutions do not appear to resolve the problem of thermally independent sensing and precise targeting. In the above discussed conventional systems, the global and local mismatch stresses were not minimized in a best possible manner. The differential (temperature-dependent) mismatches were also not minimized. In general, the differential thermal expansion mismatch between the constituent materials introduces a potential for feasible bow and de-lamination failure in the integrated laser assembly.

For almost all metal and oxide materials, the metal-oxide interfacial energies are conventionally characterized by very weak Van der Waals and electronic interactions. The intrinsic contact angles in these molten metals/YAG or glass pairs are larger than 90°. The polishing processes, abusing the surface of crystals and ceramics by abrasive particulates, and the inevitable roughness of the polished interface further increases the apparent contact angle and may lead to the formation of composite surfaces that are not fully covered by the deposited molten metal. Although the metallization and soldering of semiconductor laser diodes (e.g., InAs, InGaAs, etc) with heat sinking devices is a known problem, there is a need for improved wetting between the oxides, such as YAG crystal (YAG ceramic or glass) with metals.

The present disclosure provides improvements over the prior art methods for preparing a surface of YAG crystal for thermal bonding.

SUMMARY

One embodiment relates to a method for preparing a surface of a YAG crystal for thermal bonding. The method includes performing an ion implantation process to introduce nitrogen into a surface layer of the YAG crystal to replace depleted oxygen therein, to change surface energy of the surface layer of the YAG crystal and to provide desired bonding characteristics for the surface layer; and joining the ion implanted surface layer with a thermal management device configured to dissipate heat from the YAG crystal.

Another embodiment relates to a micro-chip laser device that includes a pump laser diode, a YAG crystal, and a thermal management device. The pump laser diode is configured to emit a laser beam. The YAG crystal includes a surface prepared from the method that includes performing an ion implantation process to introduce nitrogen into a surface layer of the YAG crystal to replace depleted oxygen therein, to change surface energy of the surface layer of the YAG crystal and to provide desired bonding characteristics for the surface layer; and joining the ion implanted surface layer with a thermal management device configured to dissipate heat from the YAG crystal. The YAG crystal is configured to produce pulsed light output. The thermal management device is thermally coupled to the pump laser diode and the YAG crystal and is configured to dissipate heat from the pump laser diode and the YAG crystal.

Yet, another embodiment relates to a device for forming a metallization pattern on a surface of a YAG crystal. The device includes a stationary receiving member and at least two laterally movable members. The stationary receiving member includes an adjustable opening constructed and arranged to receive a YAG crystal therein. The at least two laterally movable members are adjacently arranged with respect each other on the stationary receiving member. A nitrogen ion implanted surface layer of the YAG crystal, when received in the opening of the stationary receiving member, is exposed to receive a metallization pattern thereon. The at least two laterally movable members are constructed and arranged to permit adjustment of the opening of the stationary receiving member to form the metallization pattern of predetermined dimensions on the nitrogen ion implanted surface layer of the YAG crystal.

These and other aspects of the present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. In one example of the present disclosure, the structural components illustrated herein can be considered drawn to scale. It is to be expressly understood, however, that many other configurations are possible and that the drawings are for the purpose of example, illustration and description only and are not intended as a definition or to limit the scope of the present disclosure. It shall also be appreciated that the features of one embodiment disclosed herein can be used in other embodiments disclosed herein. As used in the specification and in the claims, the singular form of "a", "an", and "the" include plural referents unless the context clearly dictates otherwise.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Various embodiments will now be disclosed, by way of example only, with reference to the accompanying schematic drawings in which corresponding reference symbols indicate corresponding parts, in which:

FIG. 7A illustrates cross-sectional view of a YAG micro-chip with ion implanted surface layer and FIG. 7B illustrates cross-sectional view of a YAG micro-chip without ion implanted surface layer;

FIG. 8A illustrates a meniscus that generally appears at the edges of the interface and FIG. 8B illustrates a well formed and void-free interface;

DETAILED DESCRIPTION

In general, the fabrication of composite YAG crystals is associated with high temperature thermal treatments in air. These thermal treatments include different diffusion bonding and thermal annealing processes that allow to integrate the Nd3+:YAG crystal layers with Cr4+:YAG crystal layers. The thermal treatments of YAG doped with Cr4+ exhibit reversible oxidation-reduction reactions of Cr4+ ions that in turn cause change in lasing and thermal performance. The change in lasing and thermal performance is common result when using major fabrication processes, including a fabrication of Cr4+ doped YAG boules and an Adhesive-Free Bonding (practiced by ONYX®) of bi-layer wafers.

Figure 3A:
FIGS. 3A-E illustrate the fundamentals of solid state diffusion bonding integration for single crystal Nd3+: YAG and Cr4+ YAG sub-components.
Figure 3B:
Figure 3C:
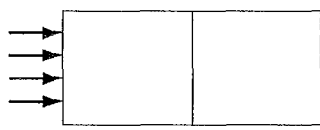
Figure 3D:
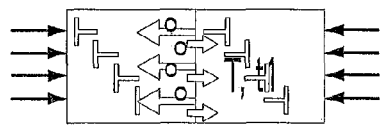
Figure 3E:
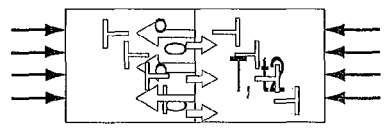

The multidimensional diffusion of, oxygen ions saturating Cr4+ doped YAG boules at high temperatures in explained in greater detail here. As fabricated, the Cr4+ doped Czochralski's grown YAG boules (Czochralski process is a method of crystal growth that is used to obtain single crystals of YAG) generally show the limited mode radial-dependent distribution of dopant in its segments. The oxidation-reduction reactions depend on both temperature and ambient environment (air/oxygen). The valence conversion of Cr4+ from active to inactive Cr3+ states is governed by diffusion of oxygen ions in YAG lattice, causing non-uniform and coordinate-dependent distribution of active (and inactive) ions of Cr dopant. Thus, the boules always include both the active Cr4+ and inactive Cr3+ sites, so the concentration of Cr4+ dopant in boule is characterized by its radial and axial profiles. A well engineered lateral dicing minimizes the effect of axial profiling for Cr4+ doped YAG boule, so its 10-20 mm thick disk preforms generally have very insignificant variation of dopant concentration over its thickness. The limited magnitude effect of radial profile is also minimized by trimming the outer layer of the YAG disk. Thus, the fabrication of thick disk preforms reduces the adverse effect of coordinate-dependent concentration of dopant. The fabrication of elongated plates retains further the apparent nonuniformity in dopant concentration profile. As can be appreciated by those skilled in the art of crystal fabrication, rational tailoring of preforms (by taking into account its crystallographic orientation and oxidation diffusion modes) minimizes the adverse effect of concentration profiling The integration of Nd3+:YAG with Cr4+:YAG crystal preforms is associated with the diffusion bonding processes involving high temperature (up to 1200° C.) processing. The major phases of diffusion bonding of two crystals are schematically illustrated in FIGS. 3A-C. For example, in a thermally assisted diffusion bonding (e.g., practiced by ONYX®), the processes are performed in air. The thermally assisted diffusion bonding of bi-layer wafers further affects the diffusion of oxygen ions saturating the Cr4+ doped YAG disk wafers. According to ONYX® (or other similar diffusion bonding processes), the thermally assisted diffusion Bonding of YAG generally includes a 1000-1200° C. annealing for about 24 hours. In general, the oxygen diffusion coefficient of about 1.83-1.87 10E-6 $cm^2/s$ at 850° C. and an activation energy of about 1.63-1.77 eV. The data may be re-calculated for the actual temperature of the diffusion bonding of choice. The uni-directional (cross-plane) non-Fikian estimate is sufficient for the first approximation of Cr4+ doped YAG layer that is partially saturated by oxygen, therefore causing partial reduction of Cr4+ into Cr3+ states. As always in uni-directional diffusion, the cross-plane C4+ concentration profile is S-shaped. Thus, the thermally assisted diffusion bonding of Nd3+ and Cr4+ doped YAG wafers changes both the site distribution and ratios of Cr4+/Cr3+ sites. The radial mode diffusion from edges also contributes to the radial and cross-plane distributions of Cr4+ sites. The finalization dicing further increases non-uniformity of the Cr4+ doped micro-chips. The shape and dimensions of wafers and chips also affect the final distribution of Cr4+ sites. With these phenomena, the most feasible fabrication process that reduces the adverse effect of valence conversion of active Cr4+ sites into inactive Cr3+ are described below.

The fabrication process includes the fabrication of preform plates with the "sacrificial" sub-layer and the selection of wafer thickness prior any thermal treatment in air. For example, the "sacrificial" sub-layer of YAG is one in which the cross-plane diffusion of oxygen ions and valence conversion minimize the amount of active Cr4+ dopant. Upper boundary estimates are made by using the uni-directional diffusion of oxygen into YAG. These estimates were verified further in spectral profiling experiment. The experiments indicate that the trimming of about 0.3-0.5 mm almost reduces the adverse effect of axial and radial oxygen diffusion and leads to nearly even concentration of Cr4+ dopant.

Similar effect may be obtained by implementation of thermal barrier ceramic coatings (e.g., zirconia-based). For example, zirconia-based thermal barrier ceramic coatings are applied and are used as the sacrificial layers.

In general, the oxidation annealing that is present in all common diffusion bonding processes for YAG, affects the fluorescence intensities of Cr4+ and Cr3+ sites. The measurable fluorescence intensities of Cr4+ and Cr3+ ions depend not only on coordinate-dependent concentrations of these species but also on their emission cross-sections. The reduction of radiation lifetime for the active Cr4+ also has to be taken into account due to the bleaching under the multiple pulsing performances. Thus, the appropriate optimization of thicknesses for Nd3+: YAG and Cr4+ YAG plates for a highly efficient micro-chip lasers, has to take into account the effects of Cr4+ and Cr3+ ions "co-existence," as well as its actual cross-sectional emission, and incorporate the effect of long-term radiation performance. One skilled in the art of crystal engineering may provide the refinement and optimization of crystal dimensions by taking into account all these effects.

The Cr4+ ions in the tetrahedral sites are essential for passive Q-switching of Cr-doped YAG lasers operating at 1064 nm band. The oxidation-reduction reactions of Cr4+ ions, diffusion and valence conversion processes are causing coordinate-dependent transition from octahedral sites to tetrahedral ones, each exhibiting a different light absorption spectrum. The change in absorption spectra for Cr4+ doped YAG due to a thermal treatment leads to a modification of optical and lasing properties, therefore impacting the performance of the Nd3+: YAG and Cr4+ YAG bonded crystals. Thus, the absorption spectra of Nd3+: YAG and Cr4+YAG bonded crystals are re-evaluated prior dicing the preform. This step is to be included in the fabrication process.

With the above 1000-1200 C thermal treatment, the three important annealing ranges of Cr4+ doped YAG are noted. The first one is associated with the relatively low-temperature annealing. The radiation effects and color center type damage, as well as partial stress relaxation, are achieved at 400-600 C treatments that are applied for just about 2-12 hours. In the case of bi-layer wafers and micro-chip laser components, the process passing this temperature interval may induce the color centers in both the bonded YAG layers. When approaching the 800-1000 C temperature interval, the YAG doped with Cr4+ exhibits reversible oxidation-reduction reactions of Cr4+ ions that leads to change in distribution of micro-defects and causes the above described valence conversion. The high-temperature annealing at about 1300 C in a reducing environment (e.g., hydrogen, nitrogen or a mix of these gases) for 1-2 hours also leads to change in distribution of defects and causes almost reversible valence conversion. Thus, the high-temperature annealing in a reducing environment is recommended as an additional and corrective step to minimize the adverse effect of diffusion bonding in air.

Also, all three thermal treatments affect refractivity of doped YAG insignificantly. The changes in optical transmission and spectral response are different and depend on the selected type of thermal annealing. Qualitatively, the thermally treated Cr4+-doped crystals change their color and tint, so the Cr4+ and Cr3+ doped crystals are attributed. In the case of relatively thin layers of Cr4+ and Cr3+ doped YAG or YAG including both these dopants the attribution presents technical problems. The thermal oxidation from Cr4+ to Cr3+ leads to the substantial reduced optical absorption (factor 2-4), primarily in 300-700 nm bands. This change in absorption may be considered as the key indicator. The magnitudes and change in absorption in 700-1100 nm band is smaller.

Summarizing the above thermal effects in oxidizing or reducing environments on spectral performance, as well as irradiation due to the thin film coating processes, it is noted that these treatments induce different lattice modifications and defects in doped YAG crystals. They are not limited to the above Cr4+/Cr3+ valence conversion, but may cause the re-charging the active dopants, uncontrolled coordination ions, trapped holes, various lattice ions at very small concentration, etc. They may form different triggering mechanisms for laser damage, ionization, recharging all leading to the uncontrolled impurity performance. When their spectral response superimposed with coordinate dependent performance of Cr4+/Cr3+ species, the response of bi-layer component to laser radiation becomes complicated. Therefore, the corrective thermal treatment in the reduced environment must be established upon the all optical requirements for laser cavity.

The present disclosure relates to solid-state laser technology. Specifically, the present disclosure provides innovative and cost effective fabrication techniques and materials for joining YAG crystal units and YAG ceramic units with alloys and sintered metal composites. The alloys and sintered metal composites are generally used in thermal networking and heat sinking devices.

The techniques are discussed in the present disclosure with respect to, for example, micro-chip lasers that are used in fabrication of proximity sensors and fuses. The proximity sensors and fuses are used in, for example, hard targeting devices, anti-armor devices, air targeting fusing devices, smart artillery munitions and airborne seeking sensors. For example, the laser fuses are configured to allow detonation of an explosive device automatically when the distance to a target becomes smaller than a predetermined value or when a moving target passes through a given space quadrant or sphere.

The present disclosure provides reliable joining of single crystal YAG, ceramic YAG, or glass-based laser materials with thermally matched and thermally conductive sintered metal composites. The sintered metal composites form active or passive heat sinking devices, including various heat exchangers, heat spreaders, and other thermal management devices. The joining techniques of the present disclosure provide temperature-independent, precision and thermally-manageable sensing and provide suppression of parasitic oscillations in laser chips.

Specifically, method 100 (as shown and described with respect to FIG. 1) of the present disclosure includes precise fabrication of crystal, ceramic, and glass laser units and adjoining thermal management devices. In addition, precise decontamination of the mating parts, Nitrogen-ion plasma-assisted implantation of mating surfaces in laser components with the subsequent metallization, and soldering or brazing of the coated laser components with sintered metal composites is disclosed.

The proposed technique of the present disclosure focuses on joining only precisely CTE (coefficient of thermal expansion) matched oxide and metal materials. The global and local mismatch stresses are minimized by appropriate material selection and dimensional design of adherent and joining (soldering) materials. The differential (temperature-dependent) mismatches are also be minimized. The differential thermal expansion mismatch between the constituent materials may introduce a bow and de-lamination failure in the assembly. Even if the constituent crystal (ceramic or glass) and metals are precisely thermally matched at a certain temperature and their differential thermal mismatch is very limited or small within the fabrication and operational cycles, the joining processes are performed at the low-temperatures. Thus, in one embodiment, low-temperature soldering and brazing are used for joining techniques to precisely CTE matched adherent laser and thermal management units.

The implantation technique of the present disclosure modifies and activates mating surfaces of YAG crystal, ceramic, and glass. The implantation-produced surface energy perturbation changes the surface potential and charging, compensates the depleted oxygen, improves wetting ability and interaction of the lasing oxide materials with the metal coatings. The technique of the present disclosure also minimizes void formation in the formed solder pool, therefore, providing efficient interfacial heat transfer.

In addition to the joining of various crystals, ceramic, or glass components with thermally matched and thermally conductive sintered metal composites to provide improvements in an interfacial conductance in the thermally manageable laser assembly, the techniques of the present disclosure also provide an effective interfacial suppression of parasitic oscillations in laser gain medium, while providing the reflection, scattering, resonance bouncing and minimizing thermal excursion and stress-induced birefringence.

Figure 1:
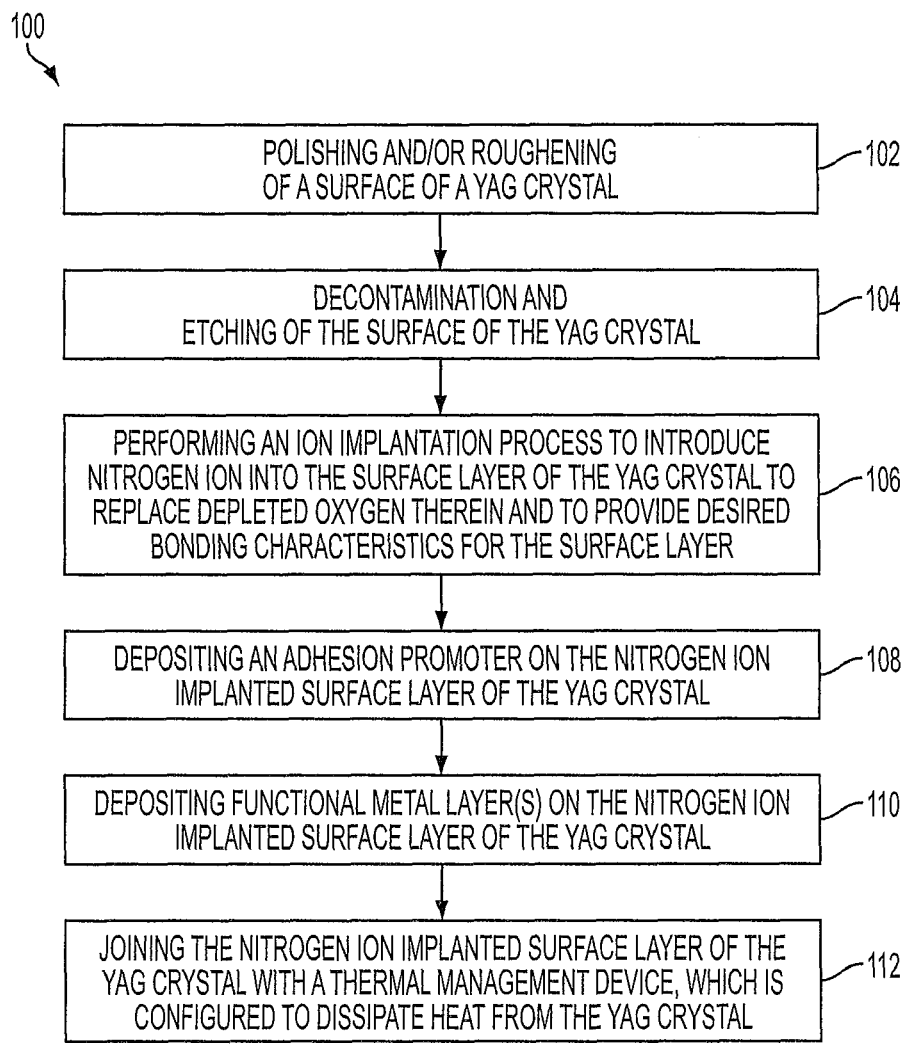
FIG. 1 is a flow chart illustrating a method for preparing a surface of a YAG crystal for thermal bonding in accordance with an embodiment of the present disclosure.
Figure 2:
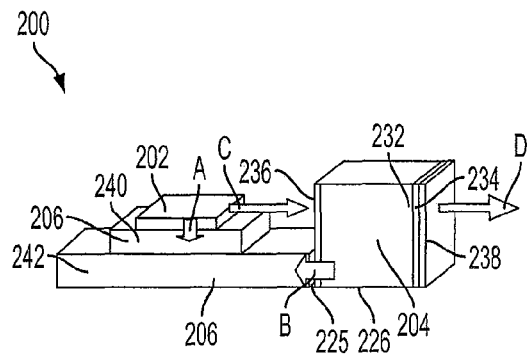
FIG. 2 illustrates an exemplary micro-chip device in which a surface of the YAG crystal is prepared from the method described in accordance with an embodiment of the present disclosure.

FIG. 1 is a flow chart illustrating method 100 for preparing surface 225 (as shown and explained in detail with respect to FIG. 2) of YAG crystal 204 (as shown and explained in detail with respect to FIG. 2) for thermal bonding in accordance with an embodiment of the present disclosure. That is, proposed fabrication technique 100 includes preparing surface 225 (including precise polishing, decontamination, performing ion implantation, performing metallization, etc.) of YAG crystal (YAG ceramic and glass) units 204 (as shown in FIGS. 2, and 4A-4C) and adjoining YAG crystal units 204 with thermal management devices 206 (as shown in FIG. 2).

At procedure 102 of method 100, polishing and/or roughening of surface layer 225 of YAG crystal 204 is performed. In one embodiment, polishing and/or roughening procedure 102 includes precise abrasive machining of crystal, ceramic or glass laser components 204.

Experimental data suggest an optimized surface roughness (i.e., a proper level of surface polishing) for the YAG crystal facilitates a better adhesion with metal layers (that will be applied later on to the YAG crystal). However, surface 225 to be activated should not be over polished.

In one embodiment, the optimized surface roughness of the YAG crystal to be metallized is generally below Ra=0.5 µm level. The coarser roughening requires functional metallization having larger thicknesses of metal layers. The excessive roughening generally causes surface cleavage and the excessive micro-cracking of crystals and glasses. The polished surface of crystal or ceramic component 204 includes amorphous polished top layer with the abrasively destroyed lattice also having the depleted oxygen.

At procedure 104, decontamination and etching of surface 225 of YAG crystal 204 is performed. In one embodiment, procedure 104 is optional. The polished crystal surface of YAG crystal components 204 is decontaminated from, for example, blocking waxes (paraffin), cooling fluids, abrasive particulates, and grinding slurries. In one embodiment, crystal 204 is subjected to chemical decontamination by using methyl benzenes (e.g., toluene and xylene). In one embodiment, the polished crystal surface of the YAG crystal is etched by immersing the YAG crystal in an aqueous solution of Hydrofluoric Acid (HF).

At procedure 106, an ion implantation process is performed to introduce nitrogen ion into surface layer 225 of YAG crystal 204. The nitrogen ion implantation is performed to activate the mating surface layer of YAG crystal 204, to perturb and change the surface potential of the mating surface layer of YAG crystal 204, to replace depleted oxygen on surface layer 225 of YAG crystal 204 and to provide desired bonding characteristics for surface layer 225 of YAG crystal 204. That is, dissimilar nitrogen introduced into the surface layer of the YAG crystal modifies and activates the surface layer of the YAG crystal. The surface modification and activation leads to a change in electro-magnetic properties of the top layer of the YAG crystal, induces the localized current carriers, and improves its poor wetting ability with the deposited metal coatings and molten solder alloys. In addition, the N-ion beam plasma activation reduces the possibility for secondary contamination. Ion implanted surface layer 225 provides desired wettability, adhesion, and surface void characteristics to provide an efficient interfacial heat transfer between YAG crystal 204 and thermal management device 206.

Cleaned (i.e., after polishing, decontaminating and etching) laser components 204 are placed in a vacuum chamber and subjected to the N-ion plasma-assisted implantation of mating surfaces 225. In one embodiment, the vacuum chamber includes a N-ion discharge source. The duration and electrical and thermal parameters of the implantation cycle are discussed in detail below. The N-ion plasma-assisted implantation allows doping the nitrogen ions into mating surface 225 of YAG crystal (YAG ceramic or glass) 204. The doped Ni-ions are in-fact the strong implant impurity ions for the yttrium alumina garnet ($Y_3Al_5O_{12}$), therefore providing surface modification and activation. The proposed implantation modifies and activates mating surfaces of the YAG crystal (YAG ceramic or glass), and improves wetting ability and interaction of the lasing oxides with the metallurgically compatible metal binders (Cr and/or Ti) and functional alloys (i.e., Ni/Au or Ni/Pt).

As noted above, the polished surface of crystal or ceramic component 204 includes amorphous polished top layer with the abrasively destroyed lattice also having the depleted oxygen. The doping of the implant impurity N-ions into the abrasively damaged and amorphous layer of YAG changes its surface potential and dielectric properties and forms a localized current carrier, compensates the depleted oxygen, activates mating surfaces 225 of YAG crystal 204 (ceramic, and glass), and improves wetting ability and interaction of the lasing oxide materials with the metal coatings. The N-ion plasma activation also improves the mobility of the ionic species on the top surface of YAG crystal 204, thereby enhancing the future metal coating and joining processes.

The nitrogen to be implanted is ionized in an ion source that is mounted inside the coating chamber. The N-ions are then extracted from the ion source, accelerated and focused inside an ion beam at a certain pre-selected energy level. The optimized physical parameters of the ion beam are predetermined (i.e., prior to implantation) by taking into account characteristics of the coating chamber (i.e., setup of the coating chamber). The ion beam is configured to brush preheated mating surface 225 of YAG (YAG ceramic or glass) 204. The duration of the ion brushing depends of the area to be coated. For example, in one embodiment, an experimentally established optimum value for the duration of the ion brushing for YAG is 2 min/mm². The ion beam brushing actions may be performed by changing its electro-magnetic parameters and also combined with the periodic lateral movements of the crystal (ceramic or glass) component. In one embodiment, the implantation procedure is divided into two or three interruptible sub-cycles. As a result of ion brushing, the accelerated N-ions penetrate the damaged and generally amorphous top layer of YAG, therefore embedding themselves into this damaged lattice, primarily on its active centers and compensating/substituting for the depleted oxygen. As noted above, this surface modification and activation leads to a change in electro-magnetic properties of the top layer of crystal (localized current carriers) and improves its poor wetting ability with the deposited metal coatings and molten solder alloys. Also, the N-ion beam plasma activation reduces the possibility for secondary contamination.

Figure 5A:
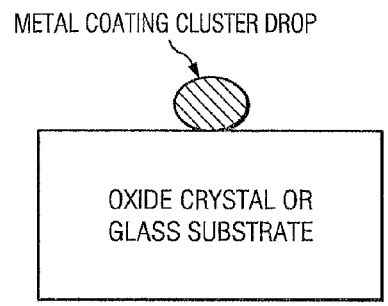
FIGS. 5A-5B illustrate wetting phenomenon for metals deposited on oxide substrates in accordance with an embodiment of the present disclosure.
Figure 5B:
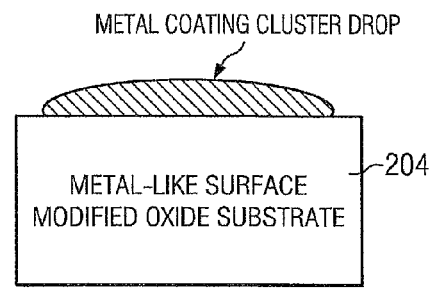

FIGS. 5A and 5B illustrate wetting phenomenon for metals deposited on oxide substrates, including the single crystal, ceramic or glass materials. Specifically, FIG. 5A illustrates wetting ability of the YAG crystal that is not subjected to the disclosed surface activation and modification and FIG. 5B illustrates wetting ability of the YAG crystal that is subjected to the disclosed surface activation and modification. As can be seen from FIGS. 5A and 5B, to overcome the poor wetting ability of YAG crystal (YAG ceramic or lasing glass), its mating surface is subjected to surface activation and modification. A comparison between the YAG crystals illustrated in FIGS. 5A and 5B show that the contact angle of metal coating (on the surface of the YAG crystal) may be increased by the surface activation and modification of the YAG crystal. That is, the N-ion beam assisted implantation provides the improved wetting of metal coatings.

The implantation described above further improves wettability if the YAG (YAG ceramic or lasing glass) surfaces are preheated prior to the implantation. In one embodiment, the preheating temperatures are compatible with the solidus/liquidus for the selected eutectic soldering alloys. For example, in one embodiment, a 20 C preheat further reduces the contact angle in Ni—Au metal-oxide interface in by 6-7 degrees, further improving YAG metallization capability. Therefore, the implantation technique modifies the top crystal layers for the subsequent metallization, soldering or brazing of the coated components with the thermally conductive alloys and the sintered metal composites.

At procedure 108, an adhesion promoter is deposited on nitrogen ion implanted surface layer 225 of YAG crystal 204. Due to a very low chemical affinity between the metals and oxide crystals, including YAG, a good adhesion promoter (binder) is deposited prior to the functional metallization. In one embodiment, the adhesion promoter is a binder. In one embodiment, the adhesion promoter is selected from the metals that are chemically compatible with the substrate material (YAG crystal, YAG ceramic or lasing glass). In one embodiment, the adhesion promoter may include chromium (Cr), Titanium (Ti), Tungsten (W) or an alloy of chromium and/or Titanium (Cr/Ti).

At procedure 110, functional metal layer(s) are deposited on nitrogen ion implanted surface layer 225 of YAG crystal 204. The metalizing is performed before the joining ion implanted surface layer 225 with thermal management device 206. In other words, the fabrication of stress-free and void-free interfaces of oxides with metals is achieved by means of metallization of the YAG crystal (YAG ceramic or glass) prior to soldering or brazing. The metal coating is deposited on the mating surface of YAG crystal 204. As will be clear from the discussions below, the metal-coated mating surface of YAG crystal 204 is then soldered or brazed to alloy or metal composite heat sink 206. In one embodiment, as will be clear from the discussions below, the metallization is also performed on surface layer 226 (as shown in FIGS. 2, and 4A-4C) of YAG crystal 204.

In one embodiment, the metallization starts immediately after the implantation, and is performed in a vacuum in the same coating chamber. In the case where low-temperature eutectic soldering (with 63/37 Sn/Pb or 60/40 Sn/Pb alloys) are used for integration of YAG crystals (or ceramics) with Cu—W composite heat spreaders, the metallization coating is formed by the sequentially deposited binder (i.e., Cr, Ti, or Cr/Ti) and the functional metals (i.e., Ni and Au). In one embodiment, these materials are metallurgically compatible with the selected solder.

In one embodiment, the functional metal layer(s) that are deposited on nitrogen ion implanted surface layer 225 of YAG crystal 204 include a Gold (Au) layer, a Nickel (Ni) layer, and a Chromium (Cr) layer. In one embodiment, the optimum thickness of the Aurum or Gold (Au) layer, the Nickel (Ni) layer, and the Chromium (Cr) layer is experimentally established. The optimum thickness for Au—Ni functional coating depends on the size of YAG crystals, duration of soldering cycle, thermal field distribution, and several other metallurgical factors. For example, in the case of the 2 millimeter cubic Nd3+: YAG and Cr4+ YAG micro-chips, the optimum thickness of the Au layer is about 0.5-0.7 μm, while the optimum thickness of the Ni layer is about 0.7-1 μm.

Figure 7A:
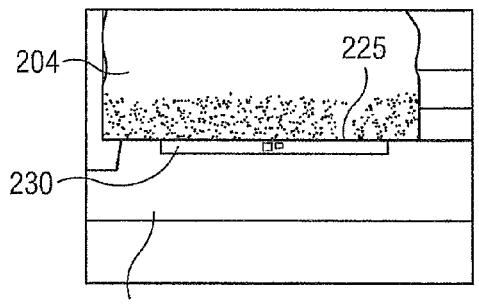
FIGS. 7A and 7B illustrate cross-sectional views of two YAG micro-chip joined with a thermal management device, specifically.

In one embodiment, a thickness of the Au layer is selected to be between about 0.5 and 0.7 μM to avoid embrittling joining layer 230 (as shown in FIG. 7A) between ion implanted surface layer 225 and thermal management device 206. In one embodiment, a thickness of the Ni layer is selected to be between about 0.7 and 1 μm so as to provide a desired wettability of ion implanted surface layer 225.

As noted above, the layers (deposited in the procedures 108 and 110) generally include the adhesion binder (e.g., Cr, Ti, or Cr/Ti) and the functional metals (e.g., Ni and Au). These coated layers are metallurgically compatible with the selected soldering alloy (e.g., 63/37 Sn/Pb or 60/40 Sn/Pb) used during joining of the YAG crystal with the thermal management device.

Figure 6A:
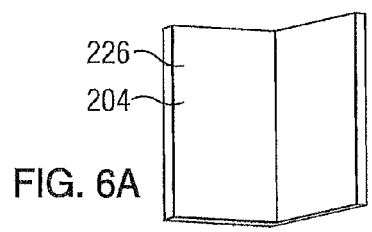
FIGS. 6A-6C illustrate a metallization layer coated on the YAG micro-chip in accordance with an embodiment of the present disclosure.
Figure 6B:
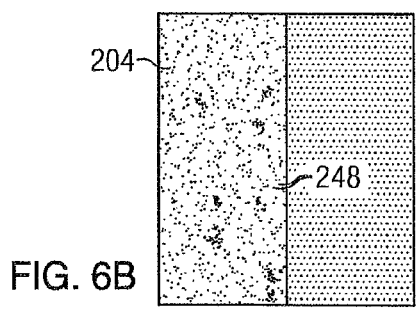
Figure 6C:
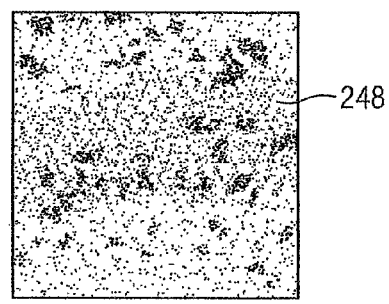

FIG. 6A shows Au—Ni—Cr coated YAG micro-chip 204. FIG. 6B details Au—Ni—Cr coated edge 248. FIG. 6C details metal-coated edge 248 by means of scanning electron microscopy (SEM). In one embodiment, the selection of functional metal layer(s) is based on metallurgical compatibility and reactions between substrate 204 and the coating materials. As noted above, the most feasible coating materials providing compatibility with conventional SnPb, AuSb, or SnAgCu eutectic soldering alloys and CuW or CuMo sintered composites are Ni and Au or Ni and Pt. The experimentally optimized thickness for binding layer of Cr is about 400-500° A. The metal coatings are deposited using evaporation or cathode sputtering coating methods. These coating methods are compatible with the N-ion beam implantation. These coating methods allow obtaining a better homogeneity of deposited metal layers. The above mentioned optimization of metallization is developed for Sn/Pb 63/37 eutectic solder and may be extended for other alloys. The maximum temperature in actual soldering cycle is assumed to be at a 5-10° C. overheat above its solidus.

In one embodiment, the proposed metallization is performed on surface 225 of the YAG or on both YAG 225 and Cu—W or Cu—Mo adherent surfaces. The second approach (i.e., where metallization is performed on both YAG 225 and Cu—W or Cu—Mo adherent surfaces) is generally suggested for laser devices requiring precise high quality of bond lines. The proposed metal coatings fully reflect the conventional and cost-effective low-temperature eutectic soldering and moderate-to-low temperature brazing.

At procedure 112, nitrogen ion implanted surface layer 225 of YAG crystal 204 is joined with thermal management device 206 (as shown and described with respect to FIG. 2). In one embodiment, the joining includes soldering or brazing. Thermal management device 206 is configured to dissipate heat from YAG crystal 204.

Figure 7B:
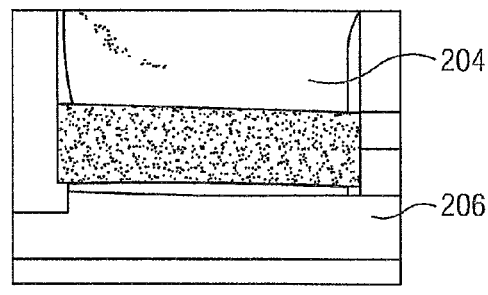

FIGS. 7A and 7B illustrate cross-sectional view of the YAG micro-chip soldered to the Cu—W passive thermal spreader. FIG. 7A illustrates the interface formation for YAG substrate 204 that was subjected to N-ion beam implantation prior to Au—Ni—Cr coating. As shown in FIG. 7A, the proposed surface implantation/activation provides a void-free interface. FIG. 7B illustrates the interface formation for the YAG substrate that was not subjected to N-ion beam implantation prior to Au—Ni—Cr coating. As shown in FIG. 7B, this interface includes a large planar void, which aggravates thermal management.

Figure 9:
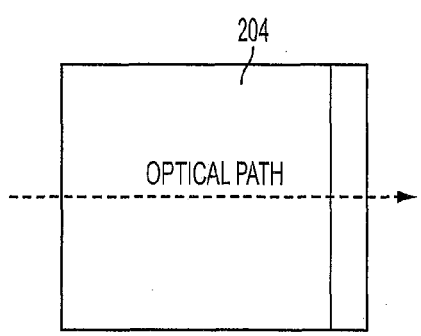
FIG. 9 illustrates a side view of the YAG micro-chip showing optical path in accordance with an embodiment of the present disclosure.

The proposed implantation minimizes voids in the formed solder pool, therefore, providing efficient interfacial heat transfer. The solder pool is fabricated so that possible inter-metallic formations that further reduce interfacial conductance are minimized. The solder pool is configured to minimize the thermal stresses in the solder joint between YAG crystal 204 and thermal management device 206, forming proper streams of molten alloy, and allowing the solder pool to solidify undisturbed. The edge patterning of the metallization further prevents the solder splashing up from an underlying pool, therefore excluding the contamination of an optical path (as shown in FIG. 9) with the light absorbing metal. The lithography masking or a precision shielding fixture may be used in the coating process. These lithography masking and/or precision shielding fixtures provide precise shaping of the solder pool on the mating surface of the YAG crystal (YAG ceramic or glass). In one embodiment, the optimum thickness of the solder pre-form is predetermined (e.g., based on several technological experiments). In the case of micro-chip soldering, 0.2-0.3 mm thick solder foil pre-forms (Sn/Pb 63/37 foils) are used. The predefined optimum thickness is further adjusted as needed to keep the dissolved Au content below a certain level (i.e., where the risk for embrittling the solder joint (inevitable inter-metallic formations)). In the case of Au/Ni metallization formula, the next process limitation is associated with decreasing wettability due to the reduced and excessively thin gold thickness. As noted above, the optimum thickness for Au—Ni functional coating depends on the size of YAG crystals, duration of soldering cycle, thermal field distribution, and several other metallurgical factors. For example, in the case of the 2 millimeter cubic Nd3+: YAG and Cr4+ YAG micro-chips, the optimum thickness of the Au layer is about 0.5-0.7 μm, while the optimum thickness of the Ni layer is about 0.7-1 μm.

Figure 8A:
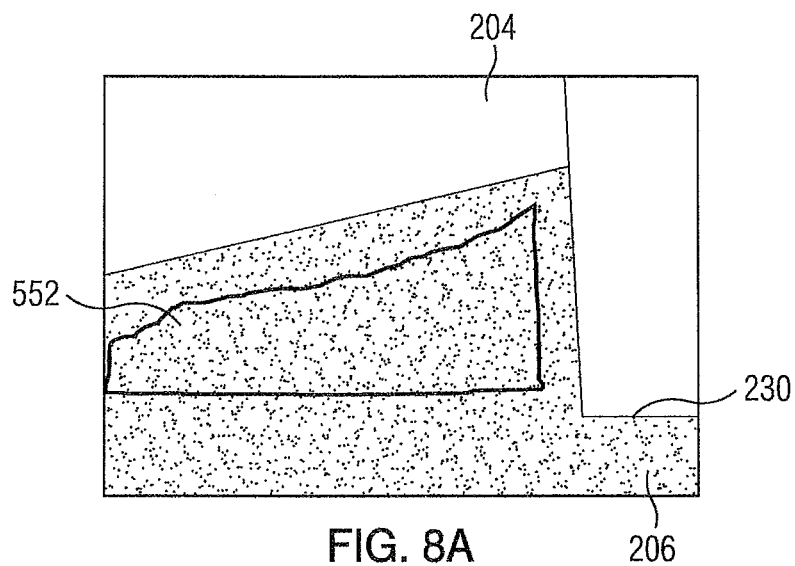
FIGS. 8A and 8B illustrate detailed views of an interface between the ion implanted surface layer of the YAG micro-chip and the thermal management device, specifically.
Figure 8B:
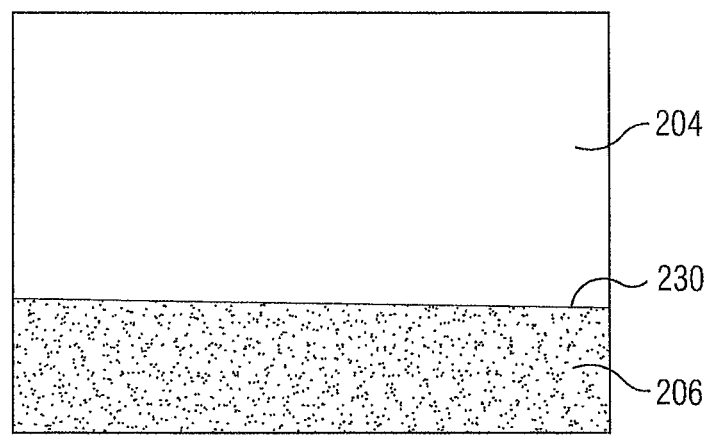

FIGS. 8A and 8B illustrate detailed views of the interface 230 between ion implanted surface layer 225 of YAG micro-chip 204 and thermal management device 206. Specifically, FIG. 8A illustrates meniscus 552 that generally appears at the edges of YAG micro-chip 204, and FIG. 8B illustrates a well formed and void-free interface 230. As seen from FIGS. 8A and 8B, the molten soldering alloy in meniscus 552 covers the dielectric AR and AR/HR coatings. The presence of molten soldering alloy in meniscus 552 not only reduces the optical aperture of laser cavity 204, but may cause catastrophic laser damage due to the absorption of light by the molten soldering alloy in meniscus 552. The application of metallization pattern 502-506 (as shown in FIGS. 10A-C) to YAG micro-chip 204 minimizes meniscus 552 (shown in FIG. 8A).

FIG. 9 illustrates a side view of YAG micro-chip 204 showing the optical path in accordance with an embodiment of the present disclosure. The application of metallization pattern 502-506 (as shown in FIGS. 10A-C) to YAG microchip 204 excludes contamination of the optical path shown in FIG. 9.

Figure 10A:
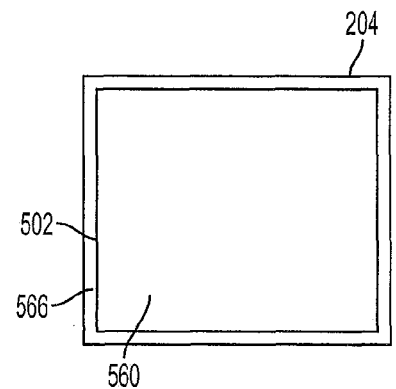
FIGS. 10A-10C illustrate three different metallization patterns formed on the ion implanted surface layer of the YAG micro-chip in accordance with an embodiment of the present disclosure.
Figure 10B:
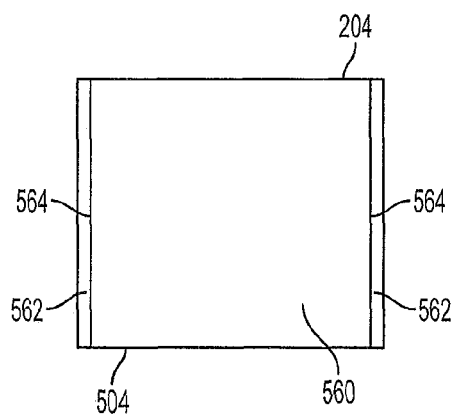
Figure 10C:
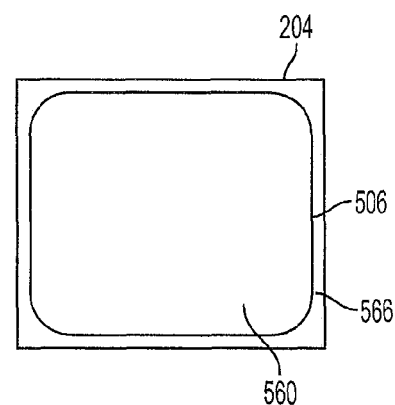

FIGS. 10A-C show three different metallization patterns 502, 504 and 506, respectively. In each of these different metallization patterns 502, 504, and 506, as shown in FIGS. 10A-C, metallization layer 560 is applied to at least a portion of nitrogen ion implanted surface layer 225 of YAG crystal 204. Also, in each of these different metallization patterns 502, 504, and 506, as shown in FIGS. 10A-C, the surface area of metallization layer 560 is smaller than surface area of nitrogen ion implanted surface layer 225 of YAG crystal 204 on which metallization pattern (502, 504, or 506) is received FIG. 10A shows metallization pattern 502 in which metallization layer 560 is formed so that at least portion 566 of nitrogen ion implanted surface layer 225 of YAG crystal 204 lies along the periphery of metallization layer 560. Metallization layer 560 of metallization pattern 502 has a rectangular shaped configuration.

Metallization layer 560 of metallization pattern 506 (shown in FIG. 10C) also has a rectangular shaped configuration, but with rounded corners. In FIG. 10C, at least portion 566 of nitrogen ion implanted surface layer 225 of YAG crystal 204 surrounds the periphery of metallization layer 560.

Metallization layer 560 of metallization pattern 504 shown in FIG. 10B is formed so that at least two edge portions 562 of nitrogen ion implanted surface layer 225 of YAG crystal 204 lie adjacent to side edges 564 of metallization layer 560.

The forming of metallization patterns 502, 504 and 506 on small size (i.e., around 1-2 millimeter) micro-chip lasers presents some engineering difficulties. In one embodiment, lithography masking may be used to form metallization patterns 502, 504 and 506 shown in FIGS. 10A-C. In another embodiment, device 500 shown in FIG. 11 may be used to form different metallization patterns 502, 504 and 506.

Figure 11:
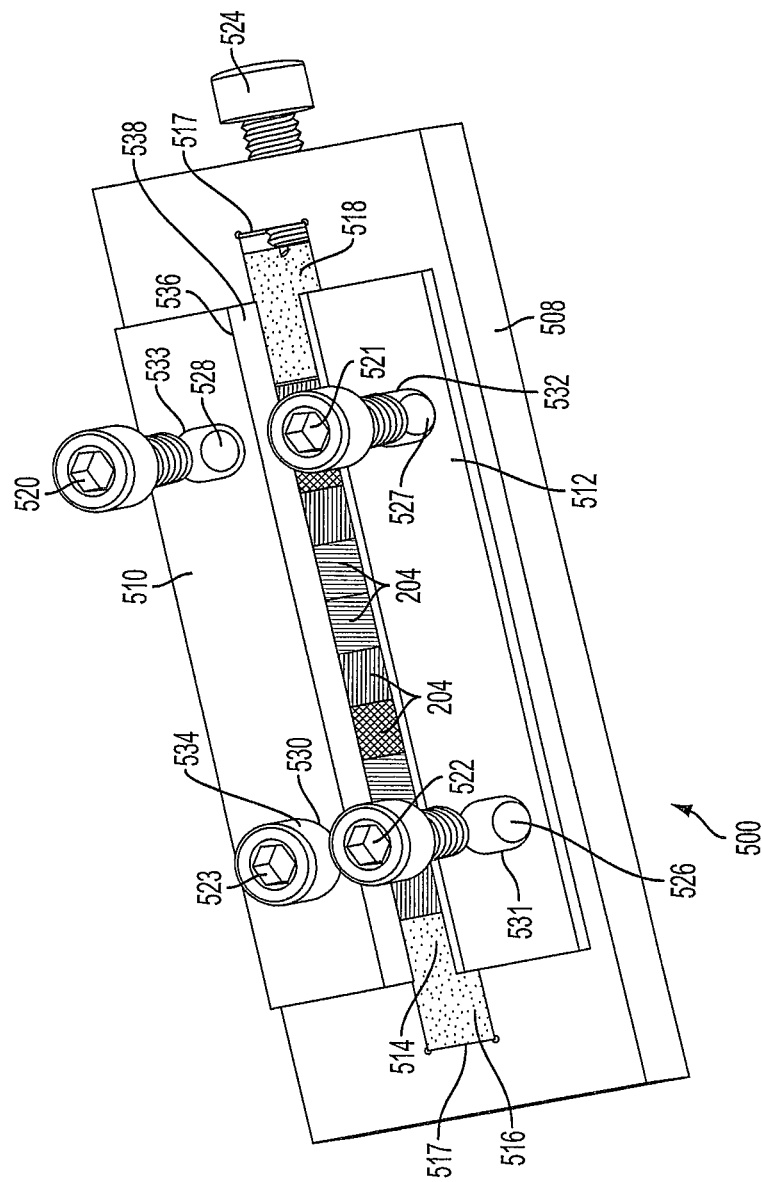
FIG. 11 illustrates a device for forming a metallization pattern on the surface of the YAG crystal in accordance with an embodiment of the present disclosure.

FIG. 11 illustrates device 500 for forming metallization pattern 502-506 (as shown in FIGS. 10A-C) on surface 225 or 226 of YAG crystal 204 in accordance with an embodiment of the present disclosure.

Device 500 includes stationary receiving member 508, at least two laterally movable members 510 and 512, at least two inserts 516 and 518, positioning members 520, 521, 522 and 523, and clamping member 524. Device 500 is configured to position 20-100 micro-chips with about 2 µm dimensional tolerance.

Stationary receiving member 508 includes adjustable opening 514 that is constructed and arranged to receive YAG crystal 204 therein. In one embodiment, adjustable opening 514 is constructed and arranged to receive a plurality of the YAG crystals therein. In one embodiment, opening 514 is in the form of an elongated, longitudinal opening.

At least two laterally movable members 510 and 512 are adjacently arranged with respect each other on stationary receiving member 508. Nitrogen ion implanted surface layer 225 of YAG crystal 204, when received in opening 514 of stationary receiving member 508, is exposed to receive the metallization pattern (e.g., metallization patterns 502-506 as shown in FIGS. 10A-C) thereon. Laterally movable members 510 and 512 are constructed and arranged to permit adjustment of opening 514 of stationary receiving member 508 to form the metallization pattern (e.g., metallization patterns 502-506 as shown in FIGS. 10A-C) of predetermined dimensions on nitrogen ion implanted surface layer 225 of YAG crystal 204.

At least two inserts 516 and 518 are received in opening 514 of stationary receiving member 508. In one embodiment, two inserts 516 and 518 are placed at opposite ends 517 of opening 514 of stationary receiving member 508. Each insert 516 or 518 is constructed and arranged to be in contact with surface 225 of YAG crystal 204 so as to avoid contact damage of dielectric coatings on surface 225 of YAG crystal 204. In one embodiment, inserts 516 and 518 are axially sliding inserts that are constructed and arranged to be received in opening 514 of stationary receiving member 508.

In one embodiment, referring to FIGS. 11 and 10A-C, laterally movable members 510 and 512 are adjusted to form the metallization pattern so that the surface area of the metallization pattern formed is smaller than surface area of nitrogen ion implanted surface layer 225 of YAG crystal 204 on which the metallization pattern is received.

In another embodiment, referring to FIGS. 11 and 10A-C, laterally movable members 510 and 512 are adjusted to form the metallization pattern so that at least a portion of nitrogen ion implanted surface layer 225 of YAG crystal 204 lies along the periphery of the metallization pattern formed.

In yet another embodiment, referring to FIGS. 11 and 10B, laterally movable members 510 and 512 are adjusted to form the metallization pattern so that at least two edge portions 562 of nitrogen ion implanted surface layer 225 of YAG crystal 204 lie adjacent to side edges 564 of the metallization pattern.

Positioning members 520, 521, 522 and 523 are constructed and arranged to position laterally moveable members 510 and 512 with respect each other on stationary receiving member 508 to permit adjustment of opening 514 of stationary receiving member 508. Positioning members 520 and 522 are received in positioning member receiving openings 526, 527, 528 and 530 of stationary receiving member 508. Movable members 510 and 512 include positioning member receiving openings 531 and 532, and 533 and 534, respectively, so that positioning member receiving openings 531, 532, 533 and 534 of movable members 510 and 512 are configured to align with positioning member receiving openings 526, 527, 528 and 530 of stationary receiving member 508 to receive positioning members 520, 521, 522 and 523 in the aligned openings therein.

In one embodiment, device 500 also includes an axial spring (not shown). Clamp member 524 and the axial spring are constructed and arranged to apply clamping force on YAG crystal 204 when YAG crystal 204 is received in opening 514 of stationary receiving member 508. In one embodiment, clamp member 524 is in the form of a self-centered spring clamping axial member.

In one embodiment, a coefficient of thermal expansion of stationary receiving member 508, positioning members 520 and 522, and moveable members 510 and 512 is selected to match a coefficient of thermal expansion of YAG crystal 204.

Interior edge 536 of each of movable members 510 or 512 have beveled or chamfered edge 538. In one embodiment, edge 538 is beveled or chamfered at a 45 degree angle. Beveled or chamfered edge 538 of each of movable members 510 and 512 allow excluding overspray of metal coating.

Colored micro-chips 204 are assembled sequentially in opening 514 of stationary receiving member 508. Elongated inserts 516 and 518 are positioned at opposite ends 517 of opening 514 of stationary receiving member 508 to prevent contact damage of the dielectric coatings. Moveable members 510 and 512 are aligned to form edge strips of the prescribed width for all the microchips. In other words, these edge strips allow the formation of desired metallization pattern 502-506 (as shown in FIGS. 10A-C) having a predetermined width. For example, in an illustrated embodiment, the arrangement shown in FIG. 11 is used to form metallization pattern 504 as shown in FIG. 10B. YAG microchips 204 are positioned into opening 514, aligned, and finally are clamped by positioning members 520, 521, 522, and 523. In one embodiment, the final positioning of YAG microchips 204 positioned into opening 514 is controlled microscopically.

In one embodiment, movable members 510 and 512, and positioning members 520 and 522 are fabricated from an alloy or metal composites. Such metal or alloy composites are characterized by close thermal compatibility with the YAG microchip 204. In one embodiment, such metal or alloy composites may include different Cu—W or Cu—Mo and a few other low expansion alloys, including ELKONITE® 10W53 (75 wt. % W; 25 wt. % Cu) that has a thermal expansion coefficient (CTE) of 8.6×10-6/K at 20° C. Device 500 shown in FIG. 11 is constructed and arranged to exclude any unwanted displacements of micro-chips in the preheated vacuum chamber.

FIG. 2 illustrates exemplary micro-chip laser device 200 in which surface layer 225 of YAG crystal 204 is prepared from method 100 described in accordance with an embodiment of the present disclosure. Exemplary micro-chip laser device 200 shown in FIG. 2 is used in, for example, a proximity fuse.

Micro-chip laser device 200 includes pump laser diode 202, composite YAG crystal 204, and thermal management device 206. Micro-chip laser device 200 of the present disclosure provides a thermally manageable laser system.

Pump laser diode 202 is configured to emit a laser beam. Pump laser diode source 202, for example, generates about 808 or 940 nm nanometer (nm) light beam. In one embodiment, pump laser diode 202 may include a group of diodes. The light is then collimated in a collimated light fiber output (or GRIN, or molded lens collimator) and delivered to micro-chip laser or YAG crystal 204. Laser components 204 are primarily composite YAG crystal or YAG ceramic units that may be fabricated by solid phase diffusion bonding.

YAG crystal 204 includes surface 225 prepared from method 100 of the present disclosure. YAG crystal 204 is configured to produce pulsed light output. YAG crystal 204 includes Nd3+ YAG layer 232; Q-switching, Cr4+ YAG layer 234; and dielectric coatings (mirrors) 236 and 238. In one embodiment, YAG crystal 204 is configured to produce 1064 nm pulsed light output.

In one embodiment, Q-switching, Cr4+YAG layer 234 is thinner than the Nd3+:YAG layer 232 and is characterized by a different color. The Cr4+ doped YAG crystals provides passive Q-switching of Nd3+:YAG laser crystals when the layers (i.e., the Cr4+YAG layer and the Nd3+:YAG layer) are integrated or bonded together. In particular, the quadrivalent Cr4+ doped garnets exhibit a wide absorption around 1 micron bandwidth with a few microsecond pulse time range. In the case of Nd3+:YAG laser with its 1064 nm emission, the absorption band of Cr4+ doped YAG allows repetitive Q-switching with the relatively low saturation fluence. Therefore, the composite crystals including Nd3+: YAG and Cr4+:YAG doped layers form a narrow bandwidth source for 1064 nm emission, which extracts laser pulses with high peak power and high repetition rates of passive Q-switching.

Figures 4A, 4B, 4C:
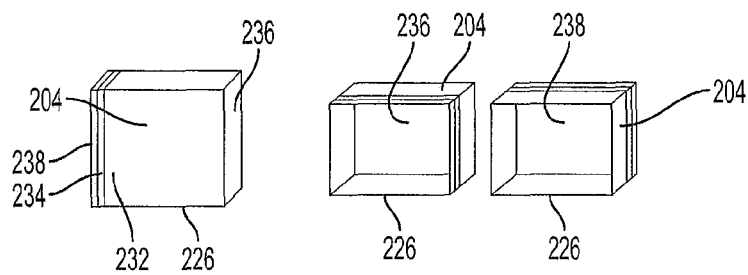
FIGS. 4A-C illustrate different views (i.e., a side view, a front view and a rear view, respectively) of an exemplary YAG micro-chip fabricated from surface activation and modification described in accordance with an embodiment of the present disclosure.

Dielectric interference coatings 236 and 238 (as shown in FIGS. 2 and 4A-C) are configured to provide high laser damage resistance. FIGS. 4A-C illustrate different views (i.e., a side view, a front view and a rear view, respectively) of YAG crystal 204.

Dielectric interference coating 236 includes anti-reflection dielectric coating 236 (as shown in FIGS. 2 and 4A-C). Dielectric interference coating 238 includes dichroic dielectric coating 238 (as shown in FIGS. 2 and 4A-C). Dichroic dielectric coating 238 includes a high reflection portion and an anti-reflection portion so as to reflect some wavelengths of light and to transmit other (operational) wavelengths of light. In one embodiment, anti-reflection dielectric coating 236 and dichroic dielectric coating 238 may be distinguished by their colors. Both coatings 236 and 238 are formed by interference thin films of high and low refractive index oxide materials. For example, $Ta_2O_5/SiO_2$ films may be used as anti-reflection dielectric coating 236 and dichroic dielectric coating 238. These $Ta_2O_5/SiO_2$ films provide the highest laser damage resistance.

The innovative laser assembly and thermal management devices of the present disclosure provide heat sinking and temperature equalization for both light emitting semiconductor diode 202 and for YAG-based micro-chip laser cavity 204 on the same thermal management platform. That is, thermal management device 206 is configured to dissipate heat from pump laser diode 202 and YAG crystal 204.

Thermal management device 206 is integrated with and thermally coupled to pump laser diode 202 and YAG crystal 204. In other words, thermal management source 206 includes conductive interfaces with YAG 204 and light emitting semiconductor diode 202. Thermal management platform 206 may operate with three or more electro-optical and electronic components that generate different heat fluxes.

Thermal management platform 206 may include at least one passive thermal spreader and at least one passive-active heat sinking device. In one embodiment, thermal management device 206 includes at least one of a heat exchanger, a heat spreader, and/or an active or passive heat sink devices As illustrated in FIG. 2, thermal management device 206 includes passive thermal spreader 240 and active heat exchanger 242. Arrows A and B show the major heat transfer modes through the interfaces. In the case of a higher power systems, passive thermal spreader 240 is further attached to active heat exchanger 242. The solder-based interfaces facilitate heat transfer from composite YAG laser components 204 to passive thermal management device 240 and active thermal management device 242. The generation of heat flux, heat transfer through the imperfect interfaces of composite crystals 204 is essential for technical solution in the present disclosure.

Precisely thermally matched passive heat spreaders 240 are designed to provide nearly perfect differential CTE compatibility with YAG crystal (YAG ceramic or lasing glass) laser components 204. In one embodiment, spreaders 240 may be fabricated from the Cu—W and/or Cu—Mo sintered composites (alloys) or AlSiC filled composites. In another embodiment, spreaders 240 may be fabricated from other advanced metal composites. The appropriate ratio between the high Copper (Cu) and low Tungsten (W) or Molybdenum (Mo) expansion constituents are predetermined, so both the global and local mismatch stresses between the YAG crystal (YAG ceramic or glass) and sintered composite are be minimized. For example, Ametek®, Sumitomo Electric Industries®, and CPS Technologies® fabricate various Cu—W, Cu—Mo and AlSiC composite pre-forms, having different constituent mass ratios. With reasonably high thermal conductivity and thermal diffusivity of different AlSiC, Cu—W and/or Cu—Mo composites, passive heat spreaders 240 and active heat exchangers 242 (that are pre-assembled to passive heat spreaders 240) are designed to ensure the ratio between the thermal masses of laser components 204 and its spreader 240 (and/or exchanger 240) does not exceed 0.01. With this thermal mass ratio or less, and with the properly selected thermal conductivity and diffusivity of sintered composites, a substantially larger thermal mass spreader 240 absorbs and quickly redistributes heat from laser components 204, light emitting diodes 202 and other electronic components. The uneven heat fluxes from diodes 202, laser cavity 204 and electronic heat sources are equalized and nearly uniformly conducted in spreader 240 in accordance with its shape and dimensions. In the case of further preassembled passive and/or active heat sink device 242 (i.e., water- or air-forced heat exchanger), the redistributed and substantially reduced flux is properly dissipated. In other words, the already redistributed and substantially reduced flux may be further transferred to active heat sink device 242 (i.e., water or air forced heat exchanger).

In one embodiment, a hermetically encapsulated cylindrical or butterfly-like (i.e., commercially available) metal housing may be used for additional mounting of micro-chip lasers 200. The housing allows packaging of laser emitting diodes 202 with the coupling fiber optic output fiber-ferrules, the collimating/focusing lenses, YAG micro-chip laser cavities 204, and thermal management systems 206 (including the above AlSiC, Cu—W or Cu—Mo heat spreaders). Moreover, the larger thermal mass of the metal housing itself further improves thermal management. The (commercially available) metal housings for laser diodes are characterized by very large (i.e., 2 or 4 order magnitude) thermal mass and therefore can be used as the secondary thermal spreaders. System 200 may also include an integrated circuit and a hermetically brazed lead frame, and a few more electrical, optical and packaging components. The light exits above system 200 through a hermetically sealed window also having the optical coatings. All the major materials used in the system are nearly CTE matched, including the housing (generally made from Kovar or Invar alloys). With the insignificant local and global thermal mismatches, the overall and local elastic stress fields, the principal deformations in the optical path, as well as the thermally-induced excursion remain very small. With the properly performed soldering, the creep deformations in solder joints and in the optical path are also very limited (e.g., even after 3-5 sequential soldering cycles at different temperatures). These considerations were verified by detailed structural and heat transfer analyses. The structural and heat transfer analyses and experimental feasibility testing are also summarized with the material properties limitations defined the following candidate composites: Ametek AMC75/25 and CPS AlSiC-9 materials. The results of the analyses allowed the selection of the following materials for thermal spreaders Ametek AMC75/25 and CPS AlSiC-9. The AMC75/25-based thermal spreader was fabricated and tested in accordance with all the operational and environmental requirements. The proximity fuse having this thermal spreader demonstrated the outstanding sensing and targeting capabilities.

Figure 12A:
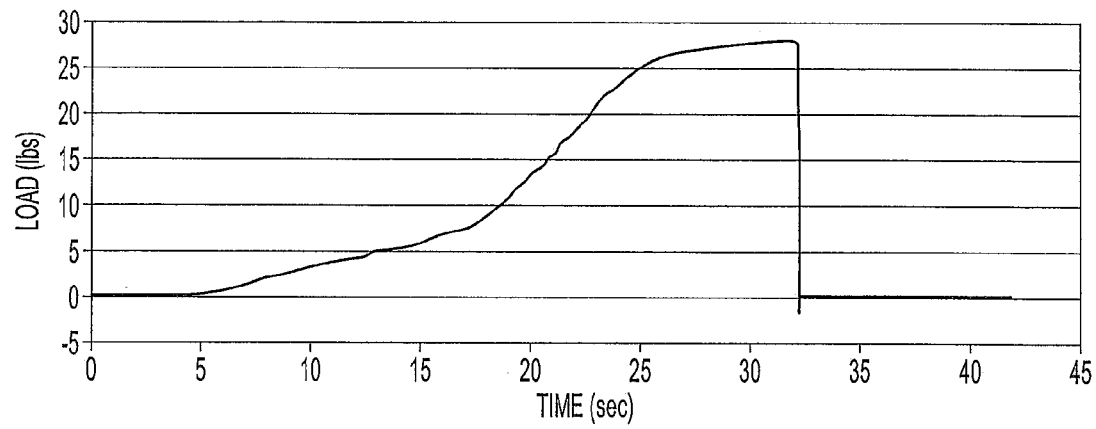
FIG. 12A illustrates experimental data when a fabricated micro-chip was subjected to an interfacial strength evaluation using a pull-off fixture shown in FIG. 12B.
Figure 12B:
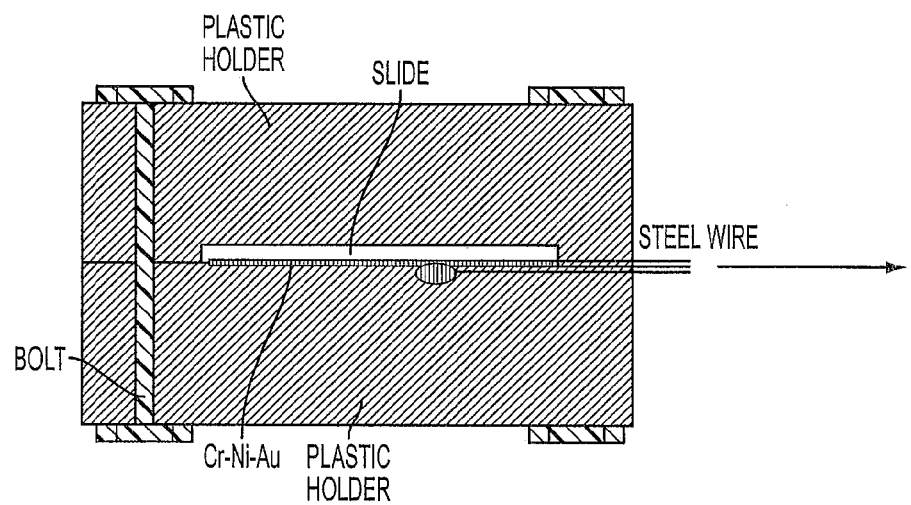

FIG. 12A-B illustrate the testing results of the YAG witness plate that was coated along with the actual micro-chip. The plates were then soldered with 0.5 and 1 mm steel wires and tested on an Instron machine using a fixture for pull-off testing. FIG. 12 A-B show a load diagram, and a cross-sectional view of the pull-off fixture, respectively. The accelerated life tests (ALTs) were also performed for revealing and understanding the physics of the expected thermo-mechanical behavior and for detecting the possible failure modes.

The fabricated micro-chip was subjected to various qualifications tests, including an evaluation of interfacial strength. The pull-off interfacial strength was evaluated by using an electro-mechanical pull-off tester. Two sets of identical Nd3+:YAG and Cr4+YAG microchips were coated using 400 A thick Chromium (Cr) binder and 0.7 micron thick Gold or Aurum (Au) and 0.7 micron thick Nickel (Ni) metallization. The first set of micro-chips was also subjected to the N-ion beam implantation and surface activation prior to coating the Au—Ni—Cr metallization layer. The second set of micro-chips was not subjected to the surface activation and implantation prior to coating the Au—Ni—Cr metallization layer. The averaged adhesion strength for the first set exceeded the 7500 pounds per square inch (psi). The averaged adhesion strength for the second set was about 1870 psi. Further optimization of deposition cycle, including the preheating and improved brushing, resulted in additional increase in the adhesive strength up to 10000 psi.

Therefore, the present disclosure provides innovations in joining and encapsulating technique and materials for the fabrication of thermally-manageable laser component assemblies.

Although the present disclosure has been described in detail for the purpose of illustration, it is to be understood that such detail is solely for that purpose and that the inventive concept is not limited to the disclosed embodiments, but, on the contrary, is intended to cover modifications and equivalent arrangements that are within the spirit and scope of the appended claims. In addition, it is to be understood that the present disclosure contemplates that, to the extent possible, one or more features of any embodiment may be combined with one or more features of any other embodiment.

What is claimed is:

1. A device for forming a metallization pattern on a surface layer of a crystal, the device comprising:
a stationary receiving member including an adjustable opening arranged to receive the crystal therein and at least two first receiving openings;
at least two laterally movable members adjacently arranged opposite each other on the stationary receiving member and including at least two second receiving openings; and
at least two inserts axially slidable relative to the crystal in the adjustable opening of the stationary receiving member, each insert arranged to be placed in contact with the surface layer of the crystal, wherein the at least two inserts are configured to be positioned partially between the at least two laterally movable members and level with the crystal in the adjustable opening of the stationary receiving member;
wherein the surface layer of the crystal, when the crystal is received in the adjustable opening of the stationary receiving member, is exposed to receive the metallization pattern thereon;
wherein the at least two laterally movable members are arranged to permit adjustment of the adjustable opening of the stationary receiving member to form the metallization pattern of predetermined dimensions on the surface layer of the crystal; and wherein the at least two second receiving openings are configured to align with the at least two first receiving openings.

2. The device of claim 1, wherein each insert is arranged to be placed in contact with the surface layer of the crystal to avoid contact damage of dielectric coatings on the surface layer of the crystal.

3. The device of claim 1, wherein the at least two laterally movable members are adjustable to form the metallization pattern such that a surface area of the metallization pattern is smaller than a surface area of the surface layer of the crystal on which the metallization pattern is received.

4. The device of claim 3, wherein the at least two laterally movable members are adjustable to form the metallization pattern such that at least a portion of the surface layer of the crystal lies along a periphery of the metallization pattern formed.

5. The device of claim 3, wherein the at least two laterally movable members are adjustable to form the metallization pattern such that at least two edge portions of the surface layer of the crystal lie adjacent to side edges of the metallization pattern.

6. The device of claim 1, further comprising:
at least two positioning members arranged to position the at least two laterally movable members with respect to each other on the stationary receiving member to permit adjustment of the adjustable opening of the stationary receiving member, the at least two positioning members being received in the first and second receiving openings when the first and second receiving openings are aligned.

7. The device of claim 1, further comprising:
a clamp member arranged to apply a clamping force on the crystal when the crystal is received in the adjustable opening of the stationary receiving member.

8. The device of claim 6, wherein coefficients of thermal expansion of the stationary receiving member, the positioning members and the laterally movable members are selected to match a coefficient of thermal expansion of the crystal.

9. The device of claim 1, wherein an interior edge of each of the laterally movable members has a beveled edge.

10. The device of claim 1, wherein the crystal comprises at least two dielectric interference coatings configured to provide high laser damage resistance.

11. The device of claim 10, wherein the two dielectric interference coatings include an anti-reflection dielectric coating and a dichroic dielectric coating.

12. The device of claim 11, wherein the dichroic dielectric coating comprises a high reflection portion and an anti-reflection portion to reflect a first set of wavelengths of light and to transmit a second set of wavelengths of light.

13. The device of claim 1, wherein the crystal comprises an Nd3+ YAG layer and a Q-switching Cr4+ YAG layer.

14. The device of claim 1, wherein the device is configured to position 20-100 micro-chips with 2 μm dimensional tolerance.

15. The device of claim 1, further comprising at least one of: a heat exchanger, a heat spreader, an active heat sink device, or a passive heat sink device.

16. The device of claim 1, wherein the adjustable opening is elongated with open ends.

17. The device of claim 1, wherein the inserts are arranged to be placed in contact with the surface layer of the crystal at opposite ends of the adjustable opening.

18. An apparatus comprising:
a stationary receiving member including an adjustable opening arranged to receive a crystal therein and at least two first receiving openings;
at least two laterally movable members arranged opposite each other on the stationary receiving member and including at least two second receiving openings, wherein the at least two laterally movable members are arranged to permit adjustment of the adjustable opening of the stationary receiving member; and
at least two inserts axially slidable relative to the crystal in the adjustable opening of the stationary receiving member, each insert arranged to be placed in contact with a surface layer of the crystal, wherein the at least two inserts are configured to be positioned partially between the at least two laterally movable members and level with the crystal in the adjustable opening of the stationary receiving member;
wherein the at least two second receiving openings are configured to align with the at least two first receiving openings.

19. The apparatus of claim 18, wherein the device is configured to position 20-100 micro-chips with 2 μm dimensional tolerance.

20. A device for forming a metallization pattern on a surface layer of a crystal, the device comprising:
a stationary receiving member including an adjustable opening arranged to receive the crystal therein;
at least two laterally movable members arranged opposite each other on the stationary receiving member; and
at least two inserts axially slidable relative to the crystal in the adjustable opening of the stationary receiving member, each insert arranged to be placed in contact with the surface layer of the crystal at opposite ends of the adjustable opening;
wherein the surface layer of the crystal, when the crystal is received in the adjustable opening of the stationary receiving member, is exposed to receive the metallization pattern thereon;
wherein the at least two laterally movable members are arranged to permit adjustment of the adjustable opening of the stationary receiving member to form the metallization pattern of predetermined dimensions on the surface layer of the crystal; and
wherein the at least two inserts in the opening of the stationary receiving member are configured to be positioned partially between the at least two laterally movable members and level with the crystal in the adjustable opening of the stationary receiving member.

21. The device of claim 20, wherein:
the stationary receiving member includes at least two first receiving openings;
the at least two laterally movable members include at least two second receiving openings, the at least two second receiving openings configured to align with the at least two first receiving openings; and
the device further comprises at least two positioning members arranged to position the at least two laterally movable members with respect to each other on the stationary receiving member, the at least two positioning members configured to be received in the first and second receiving openings when the first and second receiving openings are aligned.

* * * * *